United States Patent
Soumyanath et al.

(10) Patent No.: US 6,714,054 B2
(45) Date of Patent: Mar. 30, 2004

(54) AREA EFFICIENT WAVEFORM EVALUATION AND DC OFFSET CANCELLATION CIRCUITS

(75) Inventors: Krishnamurthy Soumyanath, Portland, OR (US); Luiz Franca-Neto, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/118,816

(22) Filed: Apr. 8, 2002

(65) Prior Publication Data

US 2003/0001654 A1 Jan. 2, 2003

Related U.S. Application Data

(62) Division of application No. 09/896,345, filed on Jun. 28, 2001.

(51) Int. Cl.[7] .............................................. H03K 17/00
(52) U.S. Cl. .......................... 327/94; 327/95; 327/91; 371/122
(58) Field of Search ........................... 327/307, 58, 61, 327/62, 91, 94, 97, 104, 262, 341, 362, 378; 341/122

(56) References Cited

U.S. PATENT DOCUMENTS

| | | | | |
|---|---|---|---|---|
| 4,091,297 A | * | 5/1978 | Stephens | 327/95 |
| 4,380,005 A | * | 4/1983 | Debord et al. | 341/118 |
| 4,590,458 A | * | 5/1986 | Evans et al. | 341/118 |
| 4,749,951 A | * | 6/1988 | Tanaka | 327/558 |
| 4,862,016 A | * | 8/1989 | Genrich | 327/94 |
| 4,965,867 A | * | 10/1990 | Tsuchida et al. | 341/118 |
| 5,126,846 A | * | 6/1992 | Niimura | 358/167 |
| 5,164,616 A | * | 11/1992 | Lewis et al. | 327/95 |
| 5,517,150 A | * | 5/1996 | Okumura | 327/427 |
| 5,824,577 A | * | 10/1998 | Luich | 438/233 |
| 5,917,366 A | * | 6/1999 | Nakano | 327/536 |
| 6,407,592 B2 | * | 6/2002 | Ueno | 327/95 |

* cited by examiner

Primary Examiner—Timothy P. Callahan
Assistant Examiner—Hai L. Nguyen
(74) Attorney, Agent, or Firm—Seth Z. Kalson

(57) ABSTRACT

Analog circuits for providing one or more waveform parameters, e.g., the DC offset or average, of an analog input signal. Separate biasing is not necessarily required. Some embodiments comprise field-effect-transistors (FETs) configured in various diode-connected configurations that take advantage of leakage currents through the FETs so that long resistors or large capacitors are not necessarily required. One embodiment comprises two diode-connected FETs to provide an unbiased DC offset voltage of an analog input signal.

8 Claims, 4 Drawing Sheets

AREA EFFICIENT WAVEFORM EVALUATION AND DC OFFSET CANCELLATION CIRCUITS

The present patent application is a Divisional of prior application Ser. No. 09/896,345, filed Jun. 28, 2001, entitled AREA EFFICIENT WAVEFORM EVALUATION AND DC OFFSET CANCELLATION CIRCUITS

FIELD

Embodiments of the present invention relate to analog circuits, and more particularly, to analog circuits for providing waveform parameters.

BACKGROUND

Mixed signal circuits often evaluate several waveform parameters, such as, for example, the maximum, minimum, or average values, or the root-mean-square value. These waveform parameters are often evaluated in the analog domain because they are needed prior to A/D (analog-to-digital) conversion.

Typically, passive networks in combination with diodes (or diode-configured transistors) have been used to evaluate waveform parameters. For example, a typical averaging circuit is shown in FIG. 1, comprising resistor 102 and capacitor 104. A peak detector circuit is shown in FIG. 2, comprising diode 202 and capacitor 204. A nMOSFET (n-Metal-Oxide-Semiconductor-Field-Effect-Transistor) averaging detector is shown in FIG. 3, comprising nMOSFET 302 and parasitic capacitor 304. The gate of nMOSFET 302 is biased to a bias voltage $V_{bias}$. In FIG. 3, the output network is indicated explicitly by Output Network block 306, but it is implicit in the other figures.

Another common task in analog signal processing is the extraction of a waveform's DC (Direct Current) offset. DC offset extraction is often required for A/D conversion. Prior art DC offset extraction circuits may use passive networks. For example, the circuit of FIG. 1 may be utilized to provide a DC offset. An example of a typical prior art DC offset correction circuit utilizing an active device is shown in FIG. 4, where nMOSFET 402 is biased to a bias voltage $V_{bias}$. nMOSFET 402 and capacitor 404 provide an averaging circuit to provide a DC offset. DC Offset Correction block 406 provides the DC offset to Input Stage 410, where it is subtracted from the input signal after passing through Input Stage 408.

Prior art circuits such as FIGS. 1 and 2 require components such as resistors or diodes, and may not be compatible with some low voltage CMOS (Complementary-Metal-Oxide-Semiconductor) process technology. Prior art circuits such as FIGS. 3 and 4 require a bias voltage to bias nMOSFETs, adding to circuit complexity, and relatively large capacitances and low bias voltages may be needed to reject ripples below 1 KHz. It is advantageous to provide analog parameter evaluation circuits that take advantage of sub-micron (e.g., less than 0.13 microns) CMOS process technology without requiring diodes and resistors, and without the need for large capacitances and a separate bias voltage.

DESCRIPTION OF EMBODIMENTS

Figure 5:
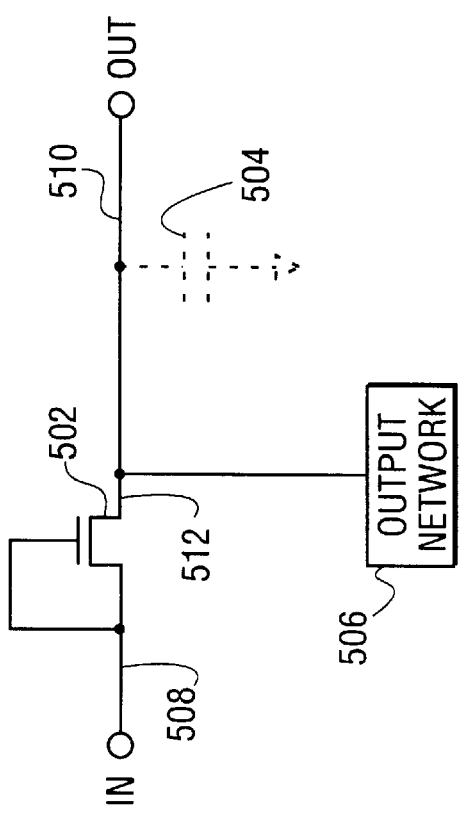
FIG. 5 is an embodiment of the present invention for providing an output voltage indicative of a local time-average maximum of an input signal.

An embodiment of the present invention is shown in FIG. 5, comprising nMOSFET 502 and parasitic capacitor 504, where the output network is indicated by Output Network block 506. The gate of nMOSFET 502 is connected to terminal 508 of nMOSFET 502. Terminal 508 may also be considered an input port to the circuit, or it may be considered connected to an input port. (Terminal 508 may also be referred to as input port 508.) nMOSFET 502 is connected in a diode configuration. Output Network 506 may be capacitive in nature, or it may comprise repeated copies of MOSFETs and capacitor combinations. Output Network 506 may also include feedback connections to input port 508.

The embodiment of FIG. 5 provides a maximum (or peak detection) function. More particularly, as described below, the embodiment of FIG. 5 provides a local time-average maximum (or local time-average peak detection) function, in the sense that it tracks a time varying maximum or peak of an input signal.

Consider first an initial state in which output port 510 is assumed to be at ground (substrate) potential and Output Network 506 is capacitive in nature. At input port 508 let there be provided an input signal comprising the sum of an AC (Alternating Current) voltage component and a DC (offset) voltage component. For now, assume that the input signal is a stationary signal. Let the amplitude of the AC component be denoted as $V_{ac}$ and the DC voltage be denoted as $V_{dc}$. (The DC offset voltage may be viewed as an average voltage, or in the case of quasi-stationary signals, a local time-average voltage.) Then MOSFET 502 turns ON in response to the input signal, where terminal 508 acts as a drain and terminal 512 acts as a source to nMOSFET 502. Output port 510 (and terminal 512 since port 510 and terminal 512 have the same potential) will charge up to $V_{dc}+V_{ac}-V_{th}$, where $V_{th}$ is the threshold voltage of nMOSFET 502.

Once output port 510 is charged to $V_{dc}+V_{ac}-V_{th}$, then nMOSFET 502 is in its sub-threshold region. Suppose the input voltage were now to decrease (e.g., it is non-stationary). Viewing terminal 512 as the drain and terminal 508 as the source to nMOSFET 502, it is seen that the gate-to-source voltage is zero. In that case, nMOSFET 502 is not turned ON. However, there is leakage (or sub-threshold) current that flows through nMOSFET 502.

Note that once the voltage at terminal 512 reaches $V_{dc}+V_{ac}-V_{th}$, it will continue to increase with sub-threshold currents whenever the input voltage is higher than the output voltage. That is, it will charge up with sub-threshold currents defined by a gate-to-source voltage $V_{gs}$ where $0<V_{gs}<V_{th}$. Then, whenever the input voltage is lower than the output voltage, the output terminal will be discharged by sub-threshold currents defined by a gate-to-source voltage of zero. Thus, the output voltage will converge to a local time-average maximum of the input signal, which will be the condition for which charging and discharging will occur with sub-threshold currents defined by gate-to-source voltages equal to zero. (For some communication applications, where $V_{ac}$ may be on the order of a few mV, this local time-average maximum value may be used as an approximate measure of the DC offset voltage.)

Variations in the input signal at input port 508 are tracked as fast as the leakage currents will allow. The embodiment of FIG. 5 takes advantage of sub-micron CMOS process technology, where the sub-threshold current may be in excess of 1 micro ampere per micron of device width. Such sub-threshold current may allow for tracking input signal voltages at millisecond rates. The tracking rate may be controlled to be slower by adjusting the device length at minimum width.

With leakage current flowing through nMOSFET 502, the effective resistance of nMOSFET 502 is higher than when nMOSFET 502 is ON, and the effective RC time constant for the combination of nMOSFET 502 and parasitic capacitor 504 may be made sufficiently large without requiring large capacitance. Input port 508 and output port 510 will switch between source and drain functionality, depending upon the relative polarities of input and output ports 508 and 510, allowing the circuit of FIG. 5 to track a non-stationary (time varying) input signal via leakage currents through nMOSFET 502.

Note that $V_{dc}+V_{ac}$ is the peak of a stationary input signal, so that the voltage $V_{dc}+V_{ac}-V_{th}$ is indicative of the maximum or peak. As described above, the circuit of FIG. 5 tracks non-stationary signals, in which case $V_{dc}+V_{ac}$ may be considered a local time-average maximum, so that the circuit of FIG. 5 provides a voltage indicate of a local time-average maximum of the input signal.

Figure 1:
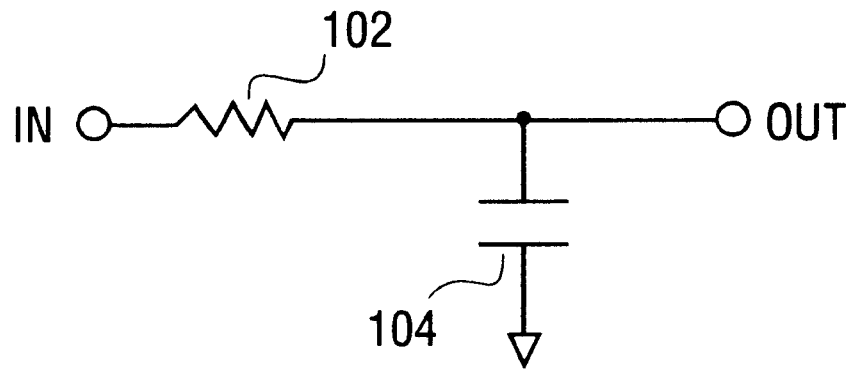
FIG. 1 is a prior art averaging circuit comprising a resistor and capacitor.
Figure 2:
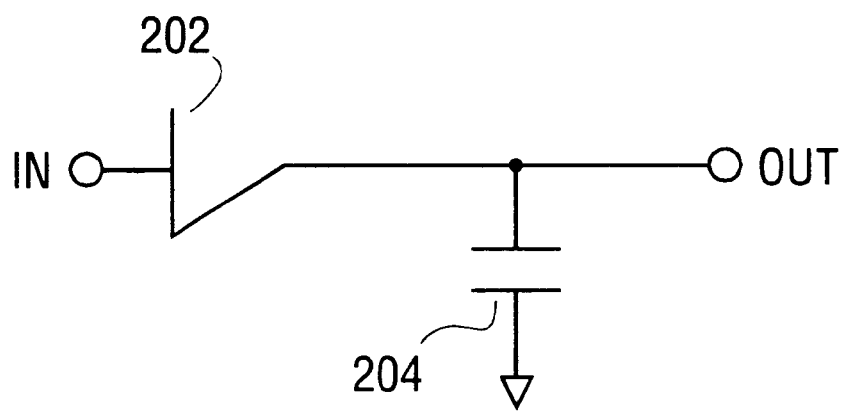
FIG. 2 is a prior art averaging circuit comprising a diode and a capacitor.
Figure 4:
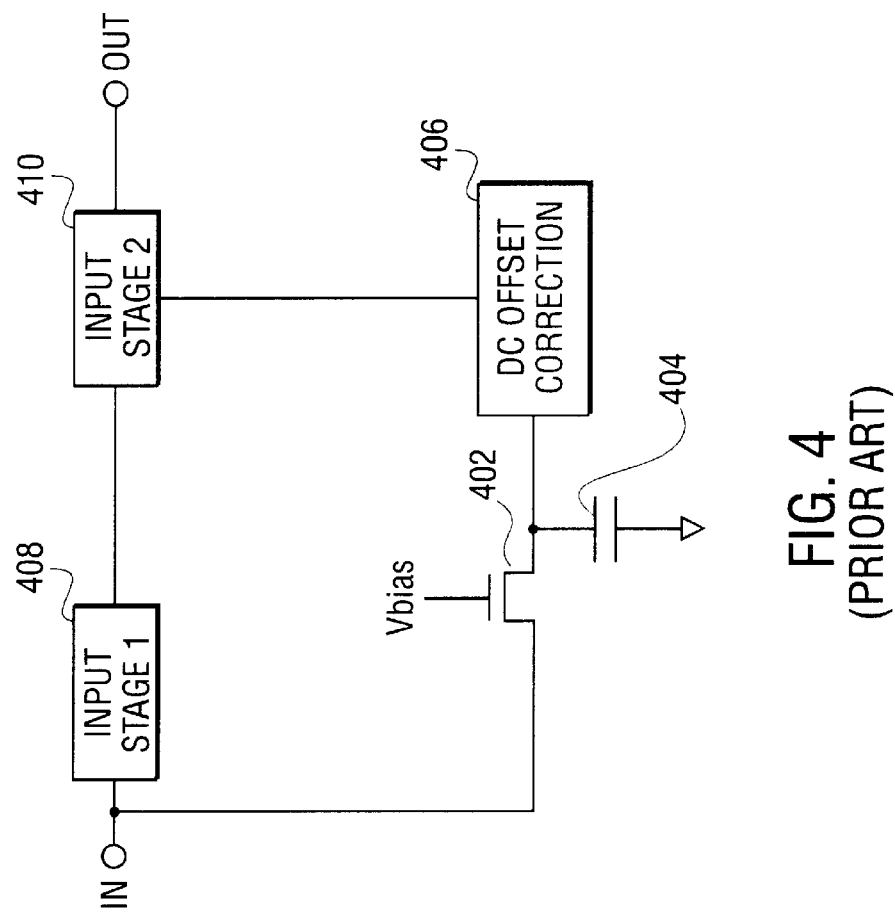
FIG. 4 is a prior art DC offset correction circuit comprising a biased field-effect-transistor.
Figure 3:
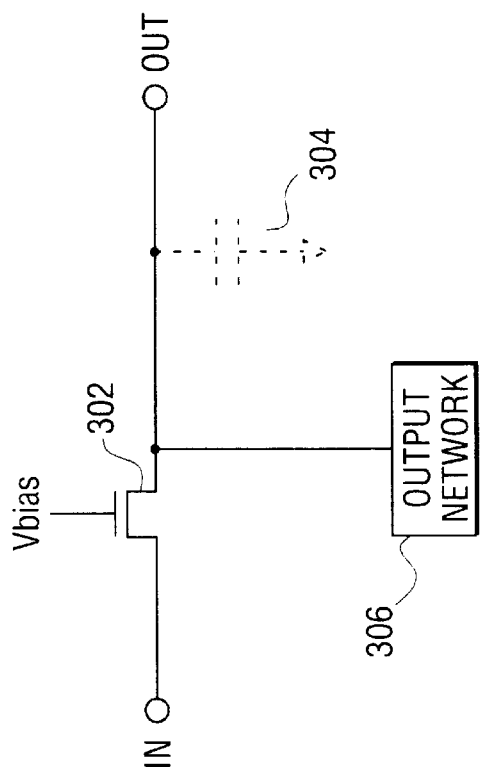
FIG. 3 is a prior art averaging circuit comprising a biased field-effect-transistor.
Figure 6:
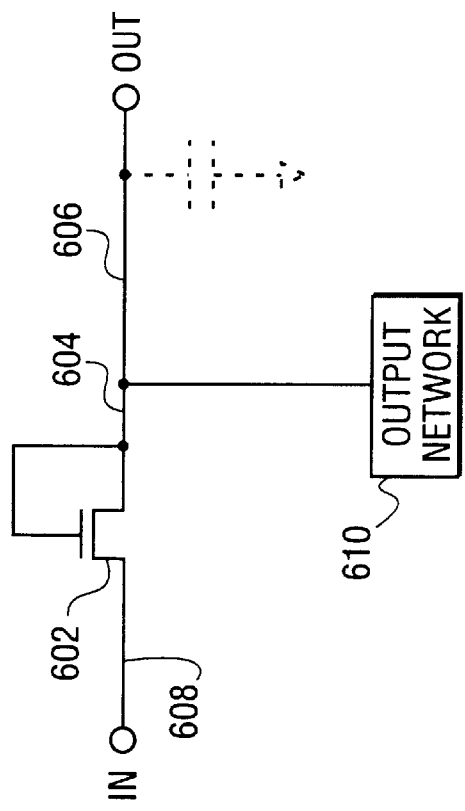
FIG. 6 is another embodiment of the present invention for providing an output voltage indicative of a local time-average minimum of an input signal.

Another embodiment is shown in FIG. 6, where sub-threshold currents discharge node 604 if the gate-to-source voltage $V_{gs}$ of nMOSFET 602 is greater than zero, $V_{gs}>0$, and charge node 604 if $V_{gs}=0$, thus providing a local time-average minimum voltage detection function as now described.

In FIG. 6, the gate of nMOSFET 602 is connected to terminal 604, which serves as output port 606. Terminal 608 of nMOSFET 602 serves as an input port to the circuit. Consider the same initial state as considered for the circuit of FIG. 5, where output port 606 is assumed to be at ground (substrate) potential and Output Network 610 is capacitive in nature. At input port 608 let there be provided an input signal comprising an AC signal component with amplitude $V_{ac}$ and a DC offset (average) voltage $V_{dc}$. Then, terminal 608 may be considered the drain and terminal 604 may be considered the source. In that case, the gate-to-source voltage is zero and nMOSFET 602 is in its sub-threshold condition so that leakage current flows, and output node 606 charges. If the input voltage were to rapidly decrease more than $V_{th}$ below the gate voltage, then nMOSFET 602 will turn ON and conduct current to discharge terminal 604. In this way, output node 606 will track the local time-average minimum of the input voltage to input port 608.

Figure 7:
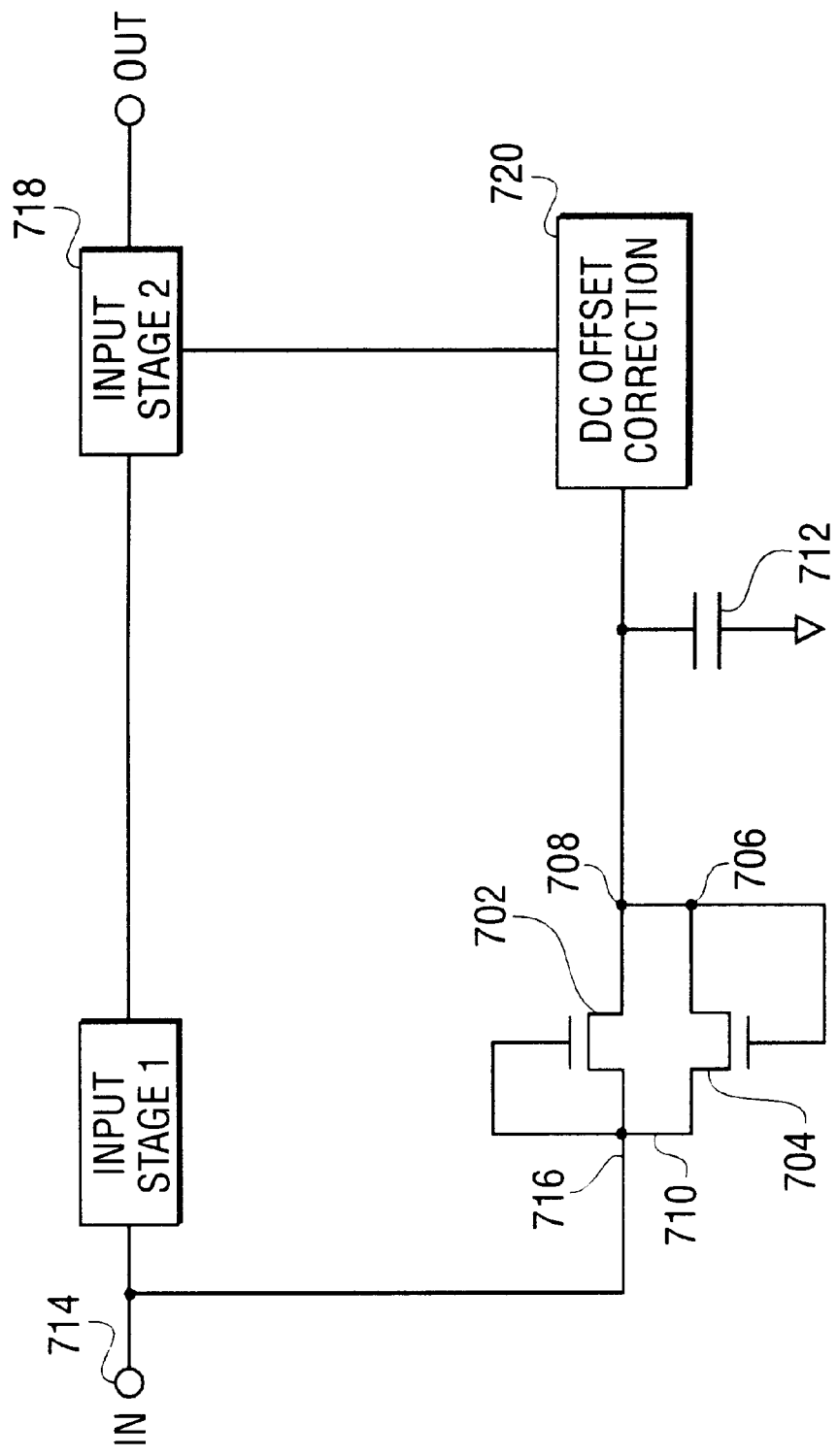
FIG. 7 is another embodiment of the present invention for providing a voltage indicative of a local time-average of an input voltage for DC offset correction.

Another embodiment is shown in FIG. 7, where charging and discharging sub-threshold currents balance each other to provide a local time-average voltage detection function (DC offset detection), which is now described.

FIG. 7 comprises a pair of sub-threshold active elements, nMOSFET 702 and nMOSFET 704, for providing local time averaging. The gate of nMOSFET 704 is connected to one of its terminals, 706, which is also connected to terminal 708 of nMOSFET 702. The gate of nMOSFET 702 is connected to terminal 710 of nMOSFET 704 and to one of its terminals, 716. Terminal 710 of nMOSFET 704 and terminal 716 of nMOSFET 702 are also connected to input port 714. Capacitor 712 is connected to terminal 708. The DC offset voltage is taken as the capacitor voltage, and is provided by DC Offset Correction 720 to Input Stage 718 where it is cancelled or subtracted from the input signal provided to input port 714.

Assume that terminal 708 is initially at ground potential, and applied to input port 714 is an input signal comprising an AC voltage component with amplitude $V_{ac}$ and a DC offset (average) component with voltage $V_{dc}$. Then nMOSFET 702 turns ON and charges capacitor 712 up to $V_{dc}-V_{th}$, where $V_{th}$ is the threshold voltage of nMOSFET 702. During this initial charging period, terminal 716 of nMOSFET 702 acts as a drain and terminal 708 acts as a source to nMOSFET 702.

After charging capacitor 712 to $V_{dc}-V_{th}$, nMOSFET 702 will be in its sub-threshold region and will provide leakage current to capacitor 712, with the gate-to-source voltage of nMOSFET 702 greater than zero. Denote the voltage at terminal 708 as $V_0$ (which is the same as the voltage on capacitor 712). If $V_0=V_{dc}$ and the excursions of the input signal voltage about $V_{dc}$ have peak values less than $V_{th}$ (e.g., $V_{ac}<V_{th}$), then it is seen that the charge provided to capacitor 712 during positive excursions of the input signal voltage about $V_{dc}$ and the charge removed from capacitor 712 during negative excursions of the input signal voltage about $V_{dc}$ each occur while nMOSFET 702 and nMOSFET 704 are in their sub-threshold regions. During charging, nMOSFET 702 has sub-threshold currents with its gate-to-source voltage greater than zero, and at the same time nMOSFET 704 charges with sub-threshold currents with its gate-to-source voltage at zero. During discharging, these roles are reversed, and nMOSFET 702 discharges with sub-threshold currents with its gate-to-source voltage at zero, and nMOSFET 704 discharges node 708 with sub-threshold currents with its gate-to-source voltage greater than zero. Because of this symmetry, it is seen that the steady state voltage of capacitor 712 is the DC offset voltage $V_{dc}$. The steady state voltage will tend to track $V_{dc}$ if it varies. Thus, the circuit of FIG. 7 provides a local time-average of the input signal.

In contrast with the circuits of FIGS. 5, and 6, the circuit of FIG. 7 may provide a more accurate measure of the time-average (DC offset voltage) of the input signal. This accuracy may be limited by the sub-threshold current mismatch between nMOSFETs 702 and 704. This matching may be superior, in some cases, to the matching of passive devices in deep sub-micron CMOS process technology As an example, for one particular 0.13 micron process technology, it is found that the steady state capacitor voltage tracks $V_{dc}$ when the positive and negative excursions of the input signal voltage about $V_{dc}$ are within 50 mV of $V_{th}$. For this particular process, $V_{th}$ may likely be in the range of 200 mV, so that differential signals of up to 300 mV peak-to-peak may be accommodated.

Thus, the circuits of FIGS. 5, 6, and 7 provide a set of structures that may be used for evaluating the waveform parameters of local time-average maximum, local time-average minimum, and local time-average DC offset across a wide range of input signal levels. For some future process technologies, leakage current may be in excess of 1 micro ampere per micron of device width. This leakage current allows input voltages to be tracked at sub millisecond rates. The tracking rate may be controlled to be as slow as desired by adjusting the active devices length at minimum width, thus mitigating the need for a large capacitor. It should be appreciated that these numerical values are representative of one particular process technology, and may vary depending upon the particular process technology used for an embodiment.

Various modifications may be made to the disclosed embodiments without departing from the scope of the invention as claimed below.

What is claimed is:

1. A circuit comprising:

an input port;

an output port;

a first field-effect-transistor (FET) having a first terminal connected to the input port, a second terminal connected to the output port, and a gate connected to the input port, and having a device width and a leakage current in excess of 1 micro ampere per micron of device width; and a second FET having a first terminal connected to the output port, a gate connected to the output port, and a second terminal connected to the gate of the first FET.

2. The circuit as set forth in claim 1, further comprising a capacitor connected to the output port.

3. The circuit as set forth in claim 1, wherein the second FET has a device width, wherein the second FET has a leakage current in excess of 1 micro ampere per micron of device width of the second FET.

4. The circuit as set forth in claim 3, the input port having an input signal voltage, the output port having an output voltage, the circuit further comprising a direct current (DC) offset correction unit responsive to the output voltage to subtract the output voltage from the input signal voltage.

5. The circuit as set forth in claim 1, the input port having an input signal voltage, the output port having an output voltage, the circuit further comprising a direct current (DC) offset correction unit responsive to the output voltage to subtract the output voltage from the input signal voltage.

6. The circuit as set forth in claim 5, further comprising a capacitor connected to the output port.

7. A method to provide a local time-average of an input signal voltage, the method comprising:

providing the input signal voltage to an input port;

providing a first field-effect-transistor (FET) having a gate connected to the input port, a first terminal connected to the input port, and a second terminal connected to an output port, wherein the first FET has a device width and a leakage current in excess of 1 micro ampere per micron of device width;

providing a second FET having a gate connected to the output port, a first terminal connected to the output port, and a second terminal connected to the gate of the first FET, wherein the second FET has a device width and a leakage current in excess of 1 micro ampere per micron of device width and sampling the output port to provide the local time-average of the input signal voltage.

8. The method as set forth in claim 7, further comprising providing a capacitor connected to the output port.

* * * * *